(12) United States Patent
Luellich et al.

(10) Patent No.: US 12,030,103 B2
(45) Date of Patent: Jul. 9, 2024

(54) ASSEMBLY WITH A STACK OF SHEET METAL JOINED FROM AT LEAST THREE SUPERIMPOSED LAYERS OF SHEET METAL

(71) Applicant: TE Connectivity Germany GmbH, Bensheim (DE)

(72) Inventors: Eike Luellich, Bensheim (DE); Karl Marc-Andreas Berger, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 205 days.

(21) Appl. No.: 17/510,801

(22) Filed: Oct. 26, 2021

(65) Prior Publication Data
US 2022/0126351 A1    Apr. 28, 2022

(30) Foreign Application Priority Data

Oct. 28, 2020  (DE) .......................... 102020128367.9

(51) Int. Cl.
| | | |
|---|---|---|
| H01R 43/16 | (2006.01) | |
| B21D 39/03 | (2006.01) | |
| H01R 12/51 | (2011.01) | |
| H01R 25/16 | (2006.01) | |

(52) U.S. Cl.
CPC .......... *B21D 39/031* (2013.01); *H01R 12/51* (2013.01); *H01R 25/161* (2013.01); *H01R 43/16* (2013.01)

(58) Field of Classification Search
CPC .... B21D 39/031; H01R 12/51; H01R 25/161; H01R 43/16

USPC .......................................................... 439/877
See application file for complete search history.

(56) References Cited

U.S. PATENT DOCUMENTS

| | | | | |
|---|---|---|---|---|
| 4,621,661 A | * | 11/1986 | Greiner ............... | F24F 13/0209 29/432 |
| 4,656,814 A | * | 4/1987 | Lockington ............. | B29C 66/43 53/DIG. 2 |
| 6,921,301 B2 | * | 7/2005 | Conrad ................ | H01R 13/112 439/867 |
| 6,974,329 B2 | * | 12/2005 | Henneberg ........... | H01R 12/585 439/59 |
| 11,324,223 B2 | | 5/2022 | Van Houten et al. | |
| 2009/0194297 A1 | | 8/2009 | Ortiz Teruel | |

(Continued)

FOREIGN PATENT DOCUMENTS

| | | |
|---|---|---|
| CA | 3070052 A1 | 1/2019 |
| CN | 101432134 A | 5/2009 |

(Continued)

OTHER PUBLICATIONS

Office Action from the Japan Patent Office dated Nov. 1, 2022, corresponding to Application No. 2021-173569 with English translation, 10 pages.

(Continued)

*Primary Examiner* — Peter G Leigh
(74) *Attorney, Agent, or Firm* — Barley Snyder

(57) ABSTRACT

An assembly includes at least three layers of sheet metal lying directly on top of one another and joined in a stack of sheet metal. The layers of sheet metal are each joined in pairs by a clinching joint. At least one layer of sheet metal arranged between one of the pairs of layers of sheet metal joined by the clinching joint and an outer side of the stack each have an access opening aligned with the clinching joint.

16 Claims, 4 Drawing Sheets

(56) References Cited

U.S. PATENT DOCUMENTS

| | | | |
|---|---|---|---|
| 2011/0079964 A1* | 4/2011 | Swasey | F16J 15/0825 |
| | | | 277/592 |
| 2011/0127078 A1 | 6/2011 | Kanemitsu | |
| 2015/0167710 A1 | 6/2015 | Scott et al. | |
| 2015/0256036 A1* | 9/2015 | Nakamura | H02K 1/276 |
| | | | 29/609 |
| 2016/0241116 A1* | 8/2016 | Mine | H02K 15/02 |
| 2017/0040850 A1* | 2/2017 | Hashimoto | H02K 15/02 |
| 2017/0089463 A1* | 3/2017 | Swasey | F16J 15/0818 |
| 2017/0368590 A1* | 12/2017 | Senda | H01F 41/0266 |
| 2019/0017601 A1* | 1/2019 | Swasey | F16J 15/0825 |

FOREIGN PATENT DOCUMENTS

| | | | |
|---|---|---|---|
| CN | 102081251 A | 6/2011 | |
| DE | 19929377 A1 | 12/2000 | |
| DE | 10310899 B3 | 5/2004 | |
| DE | 10318131 B3 | 9/2004 | |
| EP | 1531522 A1 * | 5/2005 | H01R 12/585 |
| EP | 2664394 A1 | 11/2013 | |
| EP | 3000543 A1 * | 3/2016 | B21D 28/02 |
| ES | 2286955 A1 | 12/2007 | |
| FR | 1578546 A | 8/1969 | |
| JP | 2010184292 A | 8/2010 | |
| JP | 2010278119 A | 12/2010 | |
| JP | 2012218363 A | 11/2012 | |
| KR | 20150075912 A | 7/2015 | |
| WO | 9535174 A1 | 12/1995 | |
| WO | WO-2020135926 A1 * | 7/2020 | B21D 28/16 |
| WO | WO-2020135927 A1 * | 7/2020 | B21D 28/22 |

OTHER PUBLICATIONS

Chinese First Office Action dated Oct. 24, 2023 with English translation, corresponding to Application No. 202111251885.9, 16 pages.

French Search Report and Written Opinion dated Jun. 26, 2023, corresponding to Application No. FR2111316, 8 pages.

* cited by examiner

ASSEMBLY WITH A STACK OF SHEET METAL JOINED FROM AT LEAST THREE SUPERIMPOSED LAYERS OF SHEET METAL

CROSS-REFERENCE TO RELATED APPLICATIONS

This application claims the benefit of the filing date under 35 U.S.C. § 119(a)-(d) of German Patent Application No. 102020128367.9, filed on Oct. 28, 2020.

FIELD OF THE INVENTION

The invention relates to an assembly with a stack of sheet metal joined from at least three superimposed layers of sheet metal. The invention further relates to a method for producing the stack of sheet metal.

BACKGROUND

Various options for joining several layers of sheet metal exist. For example, a reliable positive substance-fit connection can be created by welding. The disadvantage there, however, is that the high thermal load during welding can damage heat-sensitive components of the layers of sheet metal. A purely mechanical solution for joining the layers of sheet metal is, for example, screwing, which increases the weight and size of the assembly.

SUMMARY

An assembly includes at least three layers of sheet metal lying directly on top of one another and joined in a stack of sheet metal. The layers of sheet metal are each joined in pairs by a clinching joint. At least one layer of sheet metal arranged between one of the pairs of layers of sheet metal joined by the clinching joint and an outer side of the stack each have an access opening aligned with the clinching joint.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
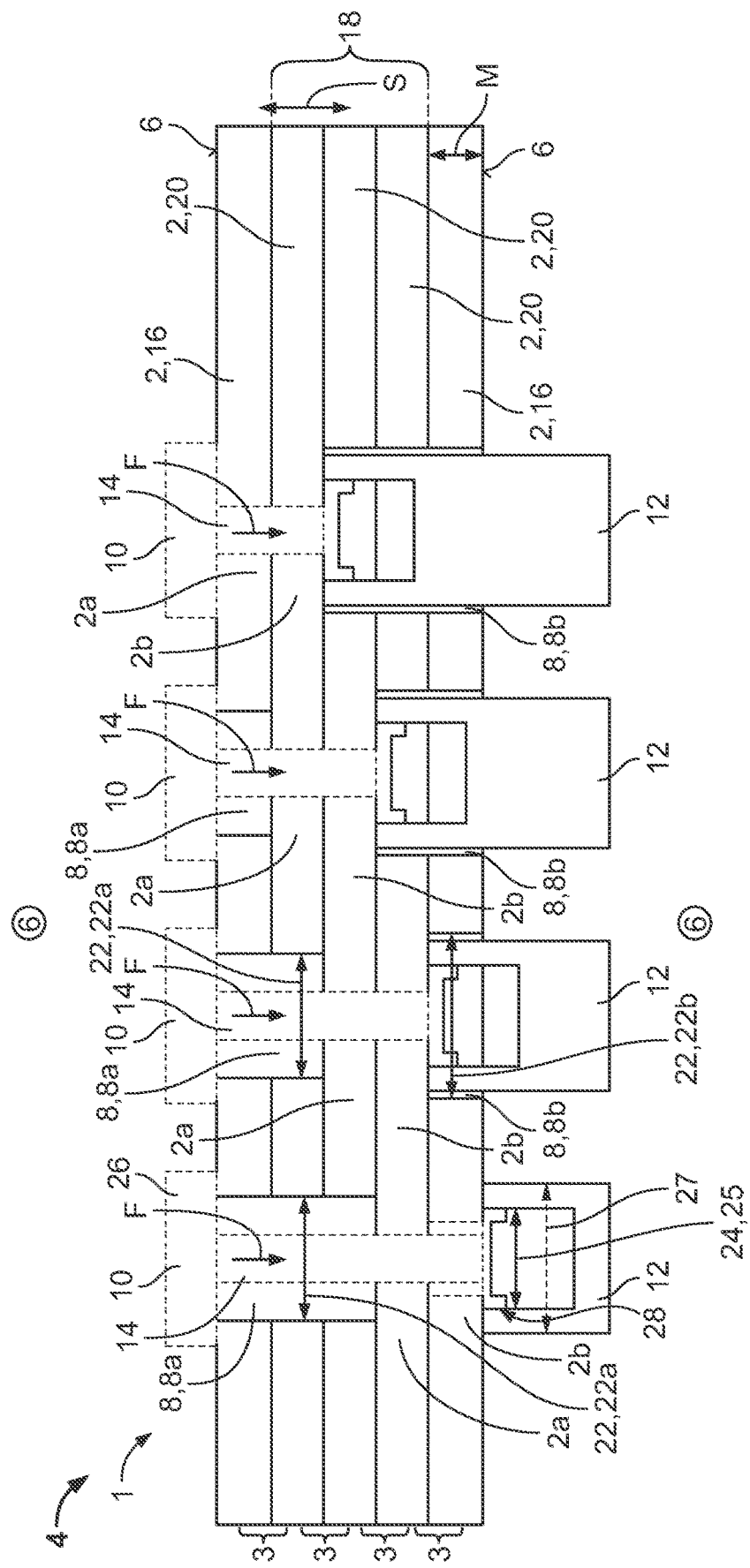
FIG. 1 is a schematic sectional view of a first exemplary configuration of an assembly according to the invention prior to clinching.

The invention shall be described hereafter by way of example in more detail using embodiments. Features of the embodiments can be omitted if the technical effect associated with these features is of no significance for a particular application. Conversely, further features can also be added to the embodiments should their technical effect be important for a particular application. In the following, the same reference numerals are used for features that correspond to one another in terms of function and/or spatial and physical configuration.

An assembly 1 according to an embodiment is shown in FIG. 1. The assembly 1 comprises a stack of sheet metal 4 which is joined from at least three layers of sheet metal 2 lying directly on top of one another, the layers of sheet metal 2a, 2b lying directly on top of one another are each joined in pairs by at least one clinching joint 28. For this purpose, layers of sheet metal 2 arranged between layers of sheet metal 2a, 2b joined by the respective clinching joint 28 and at least one outer side 6 of stack of sheet metal 2 are provided for the respective clinching with at least one access opening 8 which is in alignment with the respective clinching joint 28.

FIG. 1 illustrates assembly 1 prior to clinching. A respective clinching joint 28 is there provided for each pair of layers of sheet metal 3 of stack of sheet metal 4, wherein each pair of layers of sheet metal 3 overlaps with a further pair of layers of sheet metal 3. This means that each pair of layers of sheet metal 3 comprises at least one layer of sheet metal 2a, 2b which is at the same time layer of sheet metal 2a, 2b of another pair of layers of sheet metal 3.

Layers of sheet metal 2 are there stacked on top of one another in a stacking direction S parallel to their material thickness M. In particular, all layers of sheet metal 2 of stack of sheet metal 4 can overlap at least in sections so that layers of sheet metal 2 are joined in an orderly arranged stack of sheet metal 4.

During clinching, a layer of sheet metal 2a is pressed with the aid of a clinching punch 10 in a direction of joining F into other layer of sheet metal 2b, wherein, on its side facing away from layer of sheet metal 2a in direction of joining F, a clinching die 12 is positioned. For this purpose, clinching punch 10, which is shown schematically in FIG. 1 with dashed lines, comprises a shank 14 which can be pushed through access opening 8 and strikes against layer of sheet metal 2a. The force of punch 10 acting upon layer of sheet metal 2a results in layers of sheet metal 2a and 2b being pressed into the shape predetermined by clinching die 12 and therefore being plastically deformed. As a result, the clinching joint 28 created has a projection 29, shown in FIG. 3, protruding in direction of joining F. The direction of joining F can be parallel to the stacking direction S.

In the configuration according to FIG. 1, stack of sheet metal 4 comprises five layers of sheet metal 2 of same material thickness M lying on top of one another. However, material thickness M of layers of sheet metal 2 of stack of sheet metal 4 can also differ. Direction of joining F of each clinching joint 28 can be oriented in the same direction so that the individual clinching joints 28 can be carried out together in a single process step.

Stack of sheet metal 4 comprises two outer sheets of metal 16 which each form an end of stack of sheet metal 4 facing outer side 6 and between which a center region 18 with center sheets of metal 20 is arranged, as shown in FIG. 1. An outer sheet of metal 16 can only be part of a pair of layers of sheet metal 3 in that it is joined to center sheet of metal 20 located immediately below it. Center sheets of metal 20, on the other hand, can form a pair of layers of sheet metal 3 with each of two layers of sheet metal 2 resting directly thereon. As a result, stack of sheet metal 4 comprises an access opening 8 on a side of pair of layers of sheet metal 3 facing away from outer sheet of metal 16 during each clinching, in which one of outer sheets of metal 16 forms a joining partner of pair of layers of sheet metal 3. If two center sheets of metal 20 are to be joined, then two access openings 8 are provided, each of which extends through at least one outer sheet of metal. Inner width 22 of an access opening 8 is hereafter generally provided with reference numeral 22.

Clinching die 10 can comprise a shoulder 26, as shown in FIG. 1. Shoulder 26 can serve to strike or abut stack of sheet metal 4 when shaft 14 is inserted into access opening 8 in order to limit the depth of clinching and to thereby prevent a layer of sheet metal 2 from tearing.

The inner width 22 of an access opening 8 can be, for example, greater than the inner width 24 of the clinching die 12, which can be determined by the diameter 25 of the plastically deformed region or of the projection 29, respectively. The diameter 25 of the plastically deformed region in turn depends on the diameter of the clinching die 12, in particular its inner width 22. It should be possible to move the clinching die 12 through this access opening 8. This is the case where the inner width 22 of the access opening 8 is greater than an outer diameter 27 of the clinching die 12. An access opening 8 of such size can then specify the side of the stack of sheet metal provided for the clinching die 12.

As an alternative thereto or in addition, at least one access opening 8b with an inner width 22, 22b that is greater than diameter 24 of the clinching joint 28 and in particular greater than an outer diameter 27 of clinching die 12 can be present, as shown in FIG. 1. Clinching die 12 can then be inserted into access opening 8b.

If at least two center sheets of metal 20 form a pair of layers of sheet metal 3, access openings 8, 8a, 8b that are disposed opposite to one another with respect to layer of sheet metal pair 3, in particular arranged coaxially with respect to one another, can be provided for the respective clinching. These access openings 8, 8a, 8b can have different inner widths 22a, 22b in order to clearly and unambiguously specify direction of joining F.

In order to specify direction of joining F and to avoid errors in production, an access opening 8a can have an inner width 22a that is smaller than a diameter 24 of the clinching joint 28 and is determined by the inner width of clinching die 12. Consequently, only clinching punch 10 with shank 14 can be moved through the access opening 8a, but clinching die 12 cannot. The certain direction of joining F can be specified for a certain clinching process to prevent errors during manufacturing, for example by coding; coding can already be effected by the inner width 22 of the access openings 8 without the need for an additional processing step. The different inner widths 22 of the access openings 8 therefore represent a coding with which the direction of joining F can be specified.

In order to prevent the different clinching joints 28 from influencing or even impairing one another, it is advantageous to have, in particular, neighboring clinching joints 28 be spaced from one another substantially perpendicular to the stacking direction S. In particular, respective access openings 8 can be spaced from one another in order to also separate the individual clinching joints 28 from one another during production.

According to a further advantageous configuration, stack of sheet metal 4 can comprise exactly three layers of sheet metal 2 lying on top of one another. Such a configuration shall be explained hereafter in more detail with reference to FIGS. 2 and 3.

Figure 3:
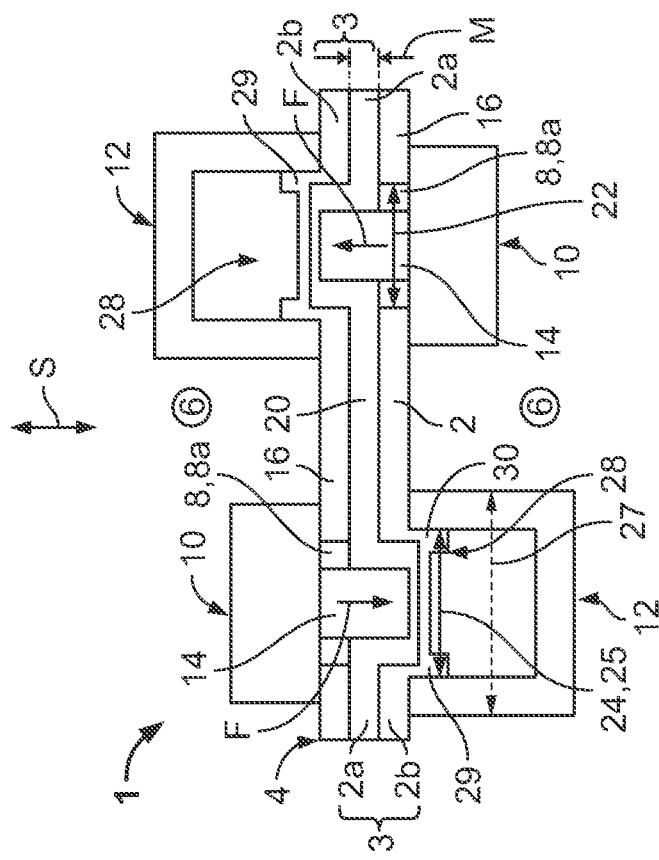
FIG. 3 is a schematic sectional view of the exemplary configuration shown in FIG. 2 after clinching.

With exactly three layers of sheet metal 2, each outer sheet of metal 16 and the center sheet of metal 20 form a pair of layers of sheet metal 3 which is joined by a clinching joint 28, as shown in FIG. 3. The different pairs of layers of sheet metal 3 joined to one another ensure that the stack of sheet metal 4 is held together.

Clinching joints 28 which have a projection 29 having a diameter 25 that protrudes from package of sheet metal 2 in direction of joining F are shown in FIG. 3. Diameter 25 is determined substantially by inner width 24 of clinching die 12. The diameter 25, as well as the shape of the clinching joint 28 or the projection 29 can there be predetermined by the clinching die 12 used in the method, in particular by its shape and/or inner width 24. Different clinching joints 28 of the assembly 1 can be configured differently from one another in terms of shape and size, which, however, could require different clinching dies 12 and/or punches 10. This is particularly useful where the layers of sheet metal 2 have different material thicknesses and/or material compositions. In this configuration, the clinching joint 28 can be optimized for the respective pair of layers 3 of sheet metal depending on their material composition and/or material thickness. Different clinching tools can be used for different clinching joints 28.

Figure 2:
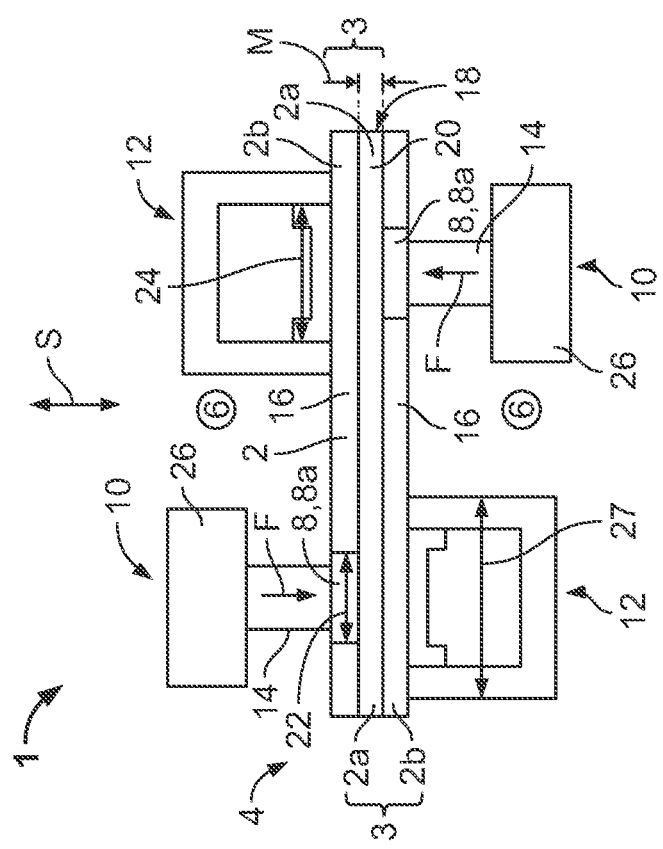
FIG. 2 is a schematic sectional view of a second exemplary configuration of an assembly according to the invention prior to clinching.

In contrast to the previous configuration, in the embodiment of FIGS. 2 and 3, different access openings 8 have same inner widths 22 so that a single tool is sufficient to produce access openings 8, for example, to drill or punch them out. Inner width 22 of access openings 8 is, in an embodiment, smaller than diameter 25 of clinching joint 28 or outer diameter 27 of clinching die 12, respectively, whereby direction of joining F can be specified. Directions of joining F of different clinching joints 28 are arranged substantially antiparallel to one another.

Figure 4:
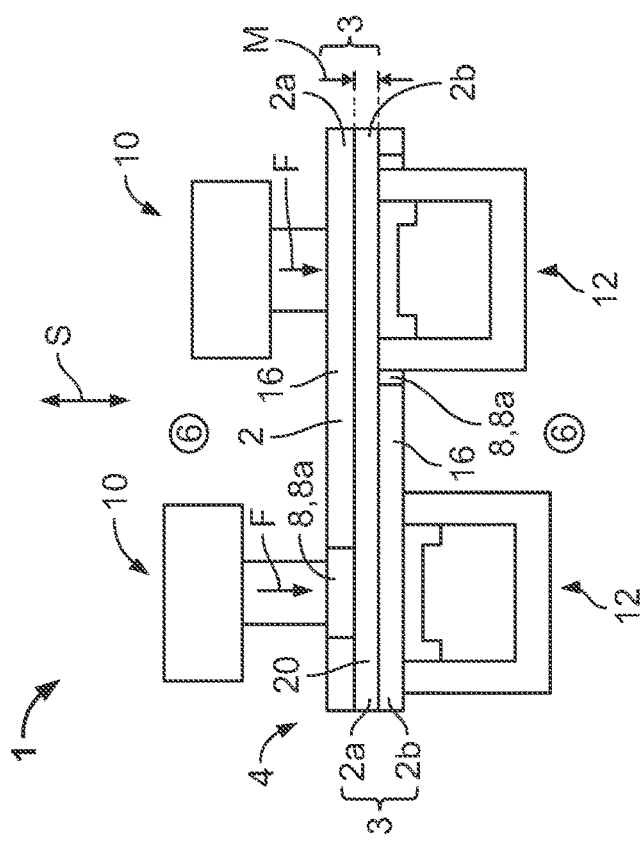
FIG. 4 is a schematic sectional view of a third exemplary configuration of an assembly according to the invention prior to clinching.

An assembly with three layers of sheet metal 2 can also be configured in such a way that direction of joining F of different clinching joints 28 is substantially parallel to one another and in the same direction. For this purpose, at least one outer sheet of metal 16 can comprise an access opening 8, 8b which is configured to receive clinching die 12, as is shown in the exemplary configuration according to FIG. 4.

Figure 5:
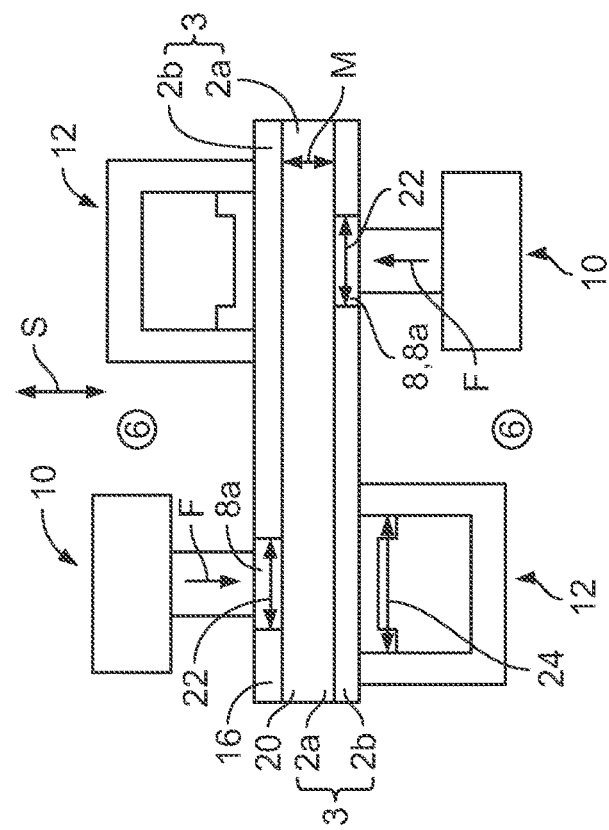
FIG. 5 is a schematic sectional view of a fourth exemplary configuration of an assembly according to the invention prior to clinching.

If the material thicknesses M of layers of sheet metal 2 differ, the layer of sheet metal 2 with greater material thickness M can be pressed in direction of joining F into layer of sheet metal 2 with lesser material thickness M. In order to ensure this, access openings 8, 8a, which terminate at layer of sheet metal 2 of a pair of layers of sheet metal with the greater material thickness, can each have an inner width 22a which is smaller than diameter 25 of clinching joint 28 or the inner width of clinching die 12. This specifies direction of joining F, as can be seen in the exemplary configuration in FIG. 5. If layer of sheet metal 2 of greater material thickness M is located between outer sheets of metal 16 of a three-layer stack of sheet metal, then direction of joining F of different pairs of layers of sheet metal 3 can be substantially antiparallel to one another.

A particularly compact electrical contact 30 can be produced with an assembly 1 according to the invention and, in an embodiment, can be used in the high-voltage or high-current range. An exemplary configuration of such an electrical contact 30 shall be explained in more detail with reference to FIG. 6.

Electrical contact 30 can comprise three layers of sheet metal 2 stacked on top of one another. Center sheet of metal 20 can be, for example, part of a busbar 32 in the embodiment of FIG. 6 which is intended to contact a printed circuit board 34 or the like. Outer sheets of metal 16 are placed onto oppositely disposed flat sides of busbar 32 so that busbar 32 and outer sheets of metal 16 form stack of sheet metal 4 at least in the section in which the busbar 32 and the outer sheets of metal 16 lie one on top of one another.

Figure 6:
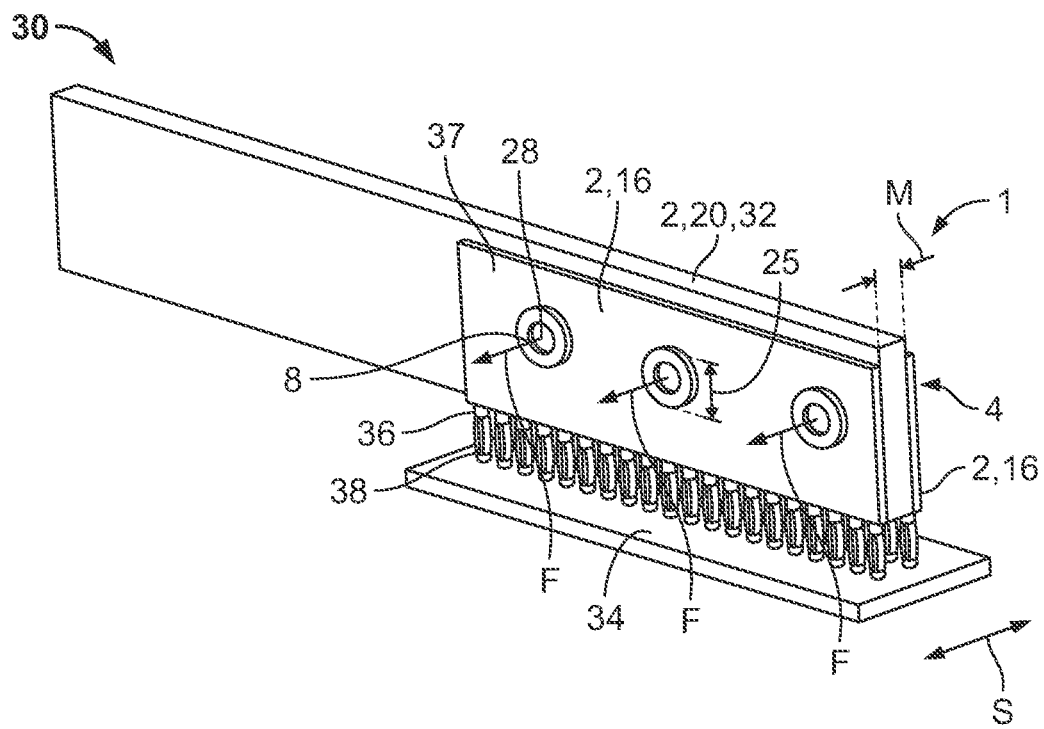
FIG. 6 is a schematic perspective view of an exemplary configuration of an electrical contact with an assembly according to the invention.

For contacting printed circuit board 34, one, and in an embodiment each, outer sheet of metal 16 can comprise at least one electrical contact element 36 shown in FIG. 6, in particular one row or several rows of contact elements 36. Multiple rows can be used in high-voltage or high-current applications, since two shorter rows of contact elements 36 arranged parallel to one another can be provided instead of a single long row of contact elements 36. With more than three layers of sheet metal 2, more than two parallel rows of contact elements 36 can also be provided.

Contact elements 36 and respective outer sheet of metal 16 can be formed integrally as a monolithic component 37, for example, in a punching and bending process. The layer of sheet metal 2 can be part of the punched strip, from the remaining part of which the at least one contact element 36 or the row of contact elements 36 can be formed. In this exemplary configuration, contact elements 36 are configured as press-in contacts 38, but they can also be configured as plug-in contacts, press-in contacts, pin contacts, contact sockets, soldered contacts or the like. If the mating connector is a printed circuit board 34, then the mating contact can be configured as a through hole into which the contact element 36 can be inserted. As an alternative thereto or in addition, the printed circuit board 34 can have a soldering point to which the contact element 36 can be soldered.

If, for example, a single contact element 36 is only approved for 10 amperes, then at least forty contact elements 36 are necessary if a current of 400 amperes is to be transmitted through contact 30. If only a single layer of sheet metal 2 can be attached to busbar 32, then layer of sheet metal 2 must have a correspondingly greater length in order to form the corresponding number of contact elements 36.

With the solution according to the invention, both sides of the busbar 32 in FIG. 6 can be used for establishing an electrical connection. Third layer of sheet metal 2, which is also provided with contact elements 36, can substantially halve the length of a single outer sheet of metal as compared to a two-layer structure. The length can be further reduced by adding more layers.

The strength of a clinching joint 28 decreases sharply as the number of layers of sheet metal 2 to be joined increases. A reliable connection by way of clinching cannot be guaranteed already with a three-layer connection. In order to avoid this, only one pair of layers of sheet metal 3 is connected directly to one another by a single clinching joint 28 in the present invention. For this purpose, each layer of sheet metal 2 not involved in the joining comprises an access opening 8 which is in alignment with a clinching joint 28. Consequently, clinching die 12 and/or clinching punch 10 can be moved through access opening 8, 8a, 8b during the joining process and join the two layers of sheet metal 2 together. The assembly 1 provides a compact stack of sheet metal 4 composed of at least three layers of sheet metal 2 joined to a high degree of bonding strength.

Due to the plastic deformation created by the clinching joint 28, the layers of sheet metal 2 are joined in a positive-fit and in a force-fit manner to one another; a resilient mechanical connection is created without the use of additional materials. The advantage over welding is that clinching is also suitable for heat-sensitive components, for layers of sheet metal 2 made of different materials, and/or layers of coated sheet metal 2. The access openings 8 make it possible for only one respective pair of layers 3 of sheet metal to be joined by a clinching joint 28, without the material of the other layers of sheet metal being stressed or deformed. Joining the layers of sheet metal 2 in pairs leads to a particularly stable connection of the stack of sheet metal 4, since increased ironing in the neck region of the clinching joint 28 is prevented, which could otherwise have a detrimental effect on the load-bearing behavior of the connection, especially in the case of shear tension.

If the connection strength of the pairs 3 of layers of sheet metal is to be increased even further, they can be connected to one another by way of several clinching joints 28 which are spaced perpendicular to stacking direction S. For this purpose, outer sheet of metal 16 can comprise several access openings 8 offset from one another perpendicular to stacking direction S, as shown in FIGS. 6 and 7.

In FIG. 6, two separate outer sheets of metal 16 are shown which are each affixed on oppositely disposed sides of center sheet of metal 20. Two outer sheets of metal 16, however, can also form an integrally formed monolithic component 40, as is shown in FIG. 7. Monolithic component 40 can be configured to be substantially U-shaped having two legs 42, wherein each one leg 42 forms an outer sheet of metal 16. Legs 42 are connected by a web 44, the length of which between legs 42, in the shown embodiment, corresponds substantially to material thickness M of center sheet of metal 20. Monolithic component 40 can therefore engage around center sheet of metal 20, wherein legs 42 are arranged substantially parallel to center sheet of metal 20 in the joined state.

Figure 7:
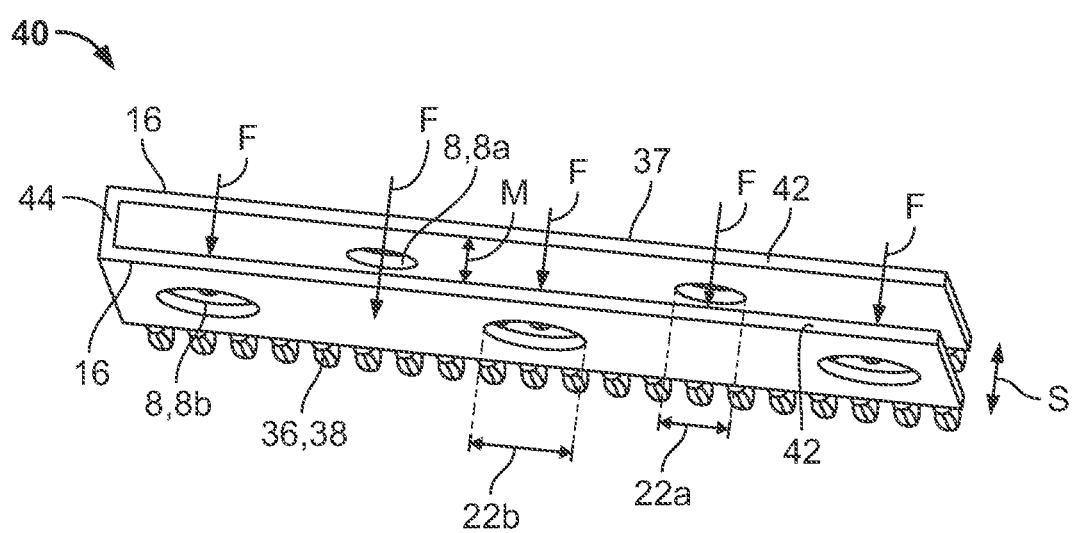
FIG. 7 is a schematic perspective view of an exemplary configuration of an outer sheet of metal of an electrical contact.

As can be seen in FIG. 7, each outer sheet of metal 16 comprises access openings 8 offset from one another perpendicular to stacking direction S, wherein inner width 22b of access openings 8 on one outer sheet of metal 16 is greater than inner width 22a of access openings 8a on other outer sheet of metal 16.

What is claimed is:

1. An assembly, comprising:
at least three layers of sheet metal lying directly on top of one another and joined in a stack of sheet metal, the layers of sheet metal are each joined in pairs by a clinching joint, at least one layer of sheet metal is arranged between one of the pairs of layers of sheet metal joined by the clinching joint and an outer side of the stack, the at least one layer of sheet metal has an access opening aligned with the clinching joint.

2. The assembly of claim 1, wherein the clinching joint is one of a plurality of clinching joints each joining one of the pairs of layers of sheet metal lying directly on top of one another.

3. The assembly of claim 2, wherein the clinching joints are spaced from one another in a direction transverse to a stacking direction in which the layers of sheet metal are stacked.

4. The assembly of claim 1, wherein the access opening of at least one of the layers of sheet metal and the outer side of the stack has an inner width smaller than an inner width of the clinching joint.

5. The assembly of claim 1, wherein the access opening of at least one of the layers of sheet metal and the outer side of the stack has an inner width greater than an inner width of the clinching joint.

6. The assembly of claim 1, wherein the access opening of the at least one layer of sheet metal has an inner width different from an inner width of the access opening of the outer side of the stack.

7. The assembly of claim 1, wherein at least two of the layers of sheet metal have a different material thickness.

8. The assembly of claim 7, wherein the access opening of at least one of the layers of sheet metal and the outer side of the stack opens toward a layer of sheet metal having a greater material thickness.

9. The assembly of claim 8, wherein the access opening has an inner width smaller than an inner width of the clinching joint.

10. The assembly of claim 7, wherein a center layer of sheet metal arranged between two layers of sheet metal has a greater material thickness than at least one of the two layers of sheet metal directly bearing against the center layer.

11. The assembly of claim 1, wherein the stack has exactly three layers of sheet metal.

12. The assembly of claim 1, wherein two outer sheets of the stack of sheet metal facing the outer side and at least partially surrounding a center sheet of metal are formed integrally as a monolithic component.

13. The assembly of claim 12, wherein the monolithic component has a U-shape.

14. An electrical contact, comprising:
an assembly including at least three layers of sheet metal lying directly on top of one another and joined in a stack of sheet metal, the layers of sheet metal are each joined in pairs by a clinching joint, at least one layer of sheet metal is arranged between one of the pairs of layers of sheet metal joined by the clinching joint and an outer side of the stack, the at least one layer of sheet metal has an access opening aligned with the clinching joint; and
an electrical contact element disposed on at least one of the layers of sheet metal.

15. The electrical contact of claim 14, wherein two outer sheets of metal of the layers of sheet metal facing the outer side each have at least one electrical contact element.

16. A method for clinching a stack of sheet metal, comprising:
providing the stack of sheet metal including at least three layers of sheet metal lying on top of one another; and
joining two layers of sheet metal lying directly on top of one another by clinching, at least one layer of sheet metal is arranged between one of the pairs of layers of sheet metal joined by the clinching joint and an outer side of the stack, the at least one layer of sheet metal has an access opening aligned with the clinching joint, a clinching punch and/or a clinching die is moved through the access opening.

* * * * *